(12) United States Patent
Leinbach et al.

(10) Patent No.: US 7,518,384 B2
(45) Date of Patent: Apr. 14, 2009

(54) METHOD AND APPARATUS FOR MANUFACTURING AND PROBING TEST PROBE ACCESS STRUCTURES ON VIAS

(75) Inventors: Glen E Leinbach, Fort Collins, CO (US); Kenneth P Parker, Ft Collins, CO (US)

(73) Assignee: Agilent Technologies, Inc., Santa Clara, CA (US)

( * ) Notice: Subject to any disclaimer, the term of this patent is extended or adjusted under 35 U.S.C. 154(b) by 243 days.

(21) Appl. No.: 11/047,070

(22) Filed: Jan. 31, 2005

(65) Prior Publication Data

US 2007/0018663 A1    Jan. 25, 2007

(51) Int. Cl.
*G01R 31/02* (2006.01)

(52) U.S. Cl. ........................ 324/754; 324/756

(58) Field of Classification Search ........................ None
See application file for complete search history.

(56) References Cited

U.S. PATENT DOCUMENTS

| | | | | |
|---|---|---|---|---|
| 3,357,099 A | * | 12/1967 | Mericle et al. ................ | 29/852 |
| 5,198,756 A | * | 3/1993 | Jenkins et al. ............... | 324/757 |
| 5,406,210 A | * | 4/1995 | Pedder ........................ | 324/757 |
| 5,686,353 A | * | 11/1997 | Yagi et al. ...................... | 438/15 |
| 5,796,590 A | * | 8/1998 | Klein .......................... | 361/774 |
| 5,909,124 A | * | 6/1999 | Madine et al. .............. | 324/761 |
| 5,930,889 A | * | 8/1999 | Klein .......................... | 29/840 |
| 6,084,781 A | * | 7/2000 | Klein .......................... | 361/771 |
| 6,114,769 A | * | 9/2000 | Thompson, Sr. ............ | 257/780 |
| 6,260,264 B1 | * | 7/2001 | Chen et al. ................... | 29/832 |
| 6,294,745 B1 | * | 9/2001 | Gruber ........................ | 174/263 |
| 6,380,060 B1 | * | 4/2002 | Zohni .......................... | 438/612 |
| 6,395,995 B1 | * | 5/2002 | Joy et al. ...................... | 174/260 |
| 6,610,430 B1 | * | 8/2003 | Thompson, Sr. ............ | 428/209 |
| 6,622,905 B2 | * | 9/2003 | Shier et al. ............. | 228/180.22 |
| 6,849,805 B2 | * | 2/2005 | Honda et al. ................ | 174/250 |
| 6,870,267 B2 | * | 3/2005 | Zohni .......................... | 257/773 |
| 7,005,750 B2 | * | 2/2006 | Liu .............................. | 257/779 |
| 7,190,157 B2 | * | 3/2007 | Parker ...................... | 324/158.1 |
| 2005/0061540 A1 | * | 3/2005 | Parker et al. ................ | 174/250 |

FOREIGN PATENT DOCUMENTS

| | | | | |
|---|---|---|---|---|
| JP | 2002043737 A | * | 2/2002 |
| JP | 2004288911 A | * | 10/2004 |
| JP | 2006107977 A | * | 4/2006 |

* cited by examiner

*Primary Examiner*—Paresh Patel

(57) ABSTRACT

One or more test probe access structures for accessing vias on a printed circuit assembly and method of fabrication thereof is presented. Each test probe access structure is conductively connected to a via at a test probe access location above an exposed surface of a via to be accessible for probing by a test probe.

9 Claims, 8 Drawing Sheets

METHOD AND APPARATUS FOR MANUFACTURING AND PROBING TEST PROBE ACCESS STRUCTURES ON VIAS

BACKGROUND OF THE INVENTION

Printed circuit assemblies (PCA's) are typically tested after manufacture to verify the continuity between devices and pads on the assembly and to verify that components loaded on the PCA perform within specifications. Such printed circuit assembly testing is generally performed with automated in-circuit testers or ICT's or simpler manufacturing defect analyzers or MDAs, and require complex tester resources. The tester hardware must generally be capable of probing conductive pads, vias and vias on the assembly under test, in order to access the net to determine continuity. Sometimes a via on net is the only outer point accessible on the net.

In-circuit testers (ICT) have traditionally used "bed-of-nails" (BON) access to gain electrical connectivity to circuit wiring (vias, nets, pads) for control and observation capability needed for testing. This necessitates having access points within the layout of circuit nets that can be targets for ICT probes. Test access structures are usually circular targets with 28 to 35 mil (0.7 to 0.9 mm) diameter that are connected to vias on the printed circuit assembly. In some cases these targets are deliberately added test pads, and in other cases the targets are "via" pads surrounding vias already provided in the printed circuit.

Smaller diameter targets are increasingly difficult to hit reliably and repeatably, especially when a test fixture may contain several thousand such probes. It is always desirable to use larger diameter targets, but this is in fundamental conflict with the industry trend towards higher densities and smaller geometry devices.

Both test pads (i.e., flat pads with no holes) and vias (i.e., flat pads with a plated through hole for layer-to-layer interconnectivity, as shown in FIGS. 1 and 2) are used for probing most printed circuit assemblies at test. Many manufacturers use unplated bare copper as their assembly finish. This copper is covered with a thin organic protective film, such as OSP or OCC, to prevent oxidation prior to assembly. The protective film dissipates during the reflow process. Without covering the bare copper with solder prior to in-circuit test, conventional probing is difficult due to the buildup of copper oxides and the hard, thin nature of the outer layer of copper. As shown in FIG. 1, if the probe 18 misses the hole 15 and contacts the copper or metal test pad via 12 surrounding hole 15, the probe 18 often may penetrate the copper pad 12 and may damage the circuitry or short 16 to internal printed circuit assembly metallization layers 14.

One method to prevent this problem is shown in FIG. 2, in which the test pad via 12 is coated with solder paste 20 that is reflowed during surface mount assembly process. This process works well to promote electrical contact and prevent damage during test, but the solder paste 20 placed on bare copper via pads 12 often melts and runs into the plated through hole 15, leaving little or no solder on the surface 22 of the via pads 12 where the test probe 18 may make contact. The solder sometimes runs into the plated through hole 15 and plugs it, also resulting in the plug of solder being coated with a non-conductive coating of flux residue 24 and 26. This prevents good test probe contact (19) if the probe 18 goes into the hole 15. These problems are exacerbated when using lead-free solders, due to the different wetting properties and increasing popularity of OSP coated bare copper metallization in lead-free processing.

BRIEF DESCRIPTION OF THE DRAWINGS

A more complete appreciation of this invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION

This invention relates to U.S. patent application Ser. No. 10/670,649 entitled Printed Circuit Assembly Test Access Structures And Methods For Making The Same filed Sep. 24, 2003 by Kenneth P. Parker, Ronald J. Peiffer and Glen E. Leinbach and assigned to Agilent Technologies, Inc. and to U.S. patent application Ser. No. 10/972,829 entitled Method and Apparatus for Manufacturing And Probing Printed Circuit Board Test Access Structures filed Oct. 25, 2004 by Kenneth P. Parker and Chris R. Jacobsen and assigned to Agilent Technologies, Inc., which teach the basic concepts of hemi-ellipsoidal bead probes or test access structure structures on printed circuit assemblies and how to manufacture and test these structures. These patent applications are incorporated herein by reference.

Turning now in detail to the invention, on a via defined in an x-, y-, z-coordinate system where the x-dimension represents the via width, the y-dimension represents the via length, and the z-dimension represents the board thickness through which the via penetrates, it will be recognized by those skilled in the art that present techniques for test access pad and test via placement on a printed circuit assembly utilize only the x- and y-dimensions. The present invention takes a different approach by taking advantage of the z-dimension. In this regard, the test access structure of the invention is one or more localized "high points" on a printed circuit assembly via that does not significantly perturb the impedance of the trace or via and that can be targeted with a probe. Throughout this specification, the phrases test probe access structure on a via and bead probe on a via are used interchangeably.

Figure 1:
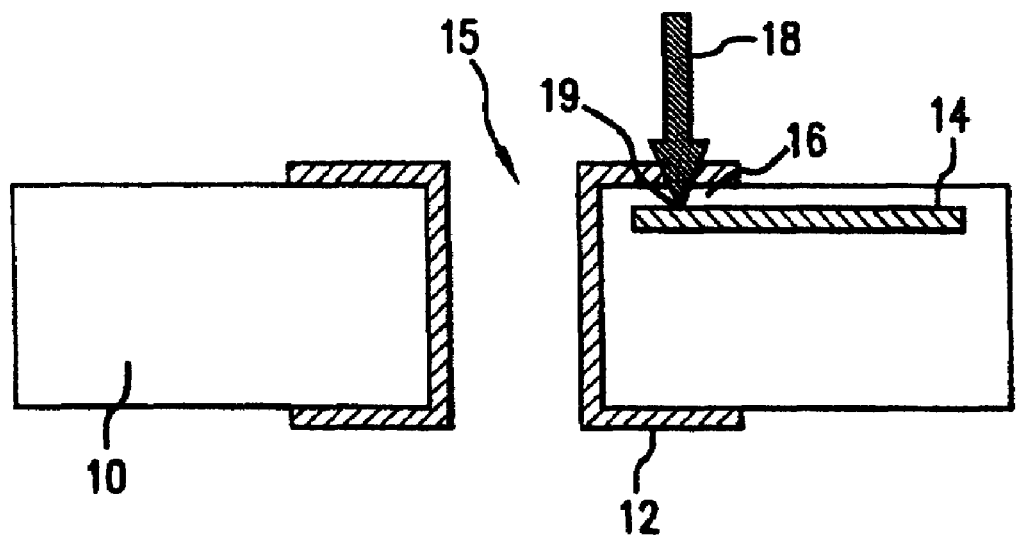
FIG. 1 is a cross-sectional side view of a conventional printed circuit assembly test via.
Figure 2:
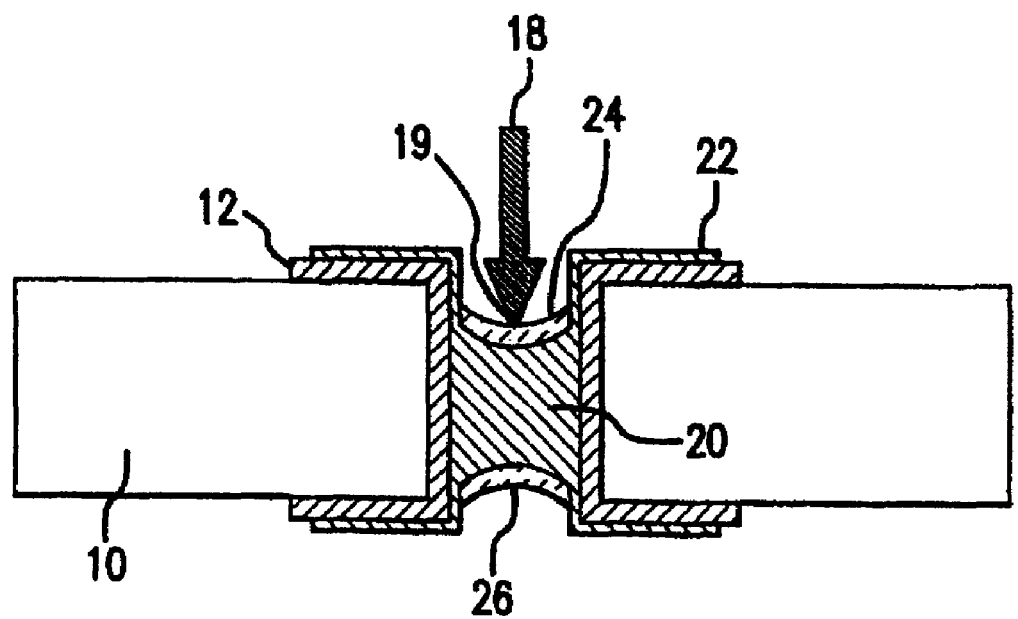
FIG. 2 is a cross-sectional view of a conventional printed circuit assembly test via with a solder plug in the via hole.
Figure 3:
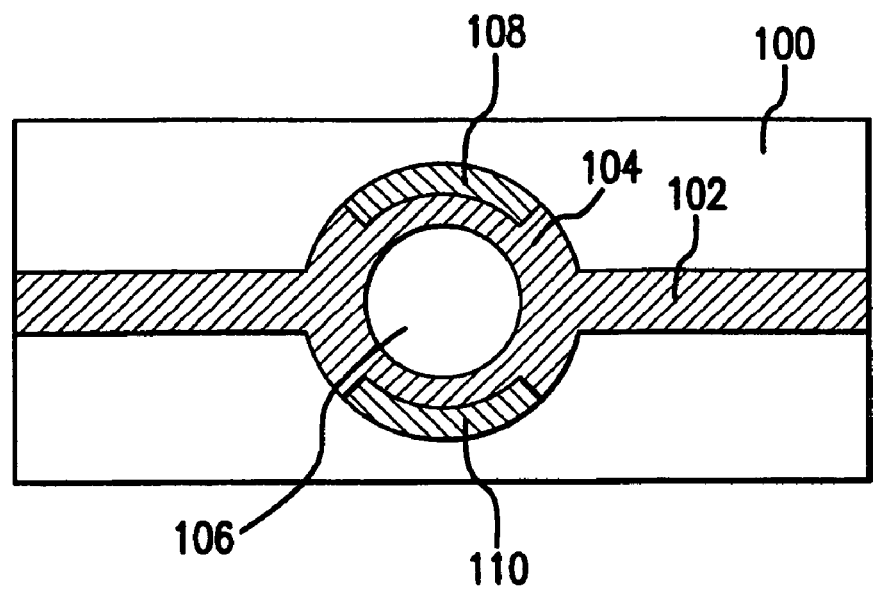
FIG. 3 is a top view of a test probe access structure pattern before solder paste and reflow on a test via on a printed circuit assembly.
Figure 4:
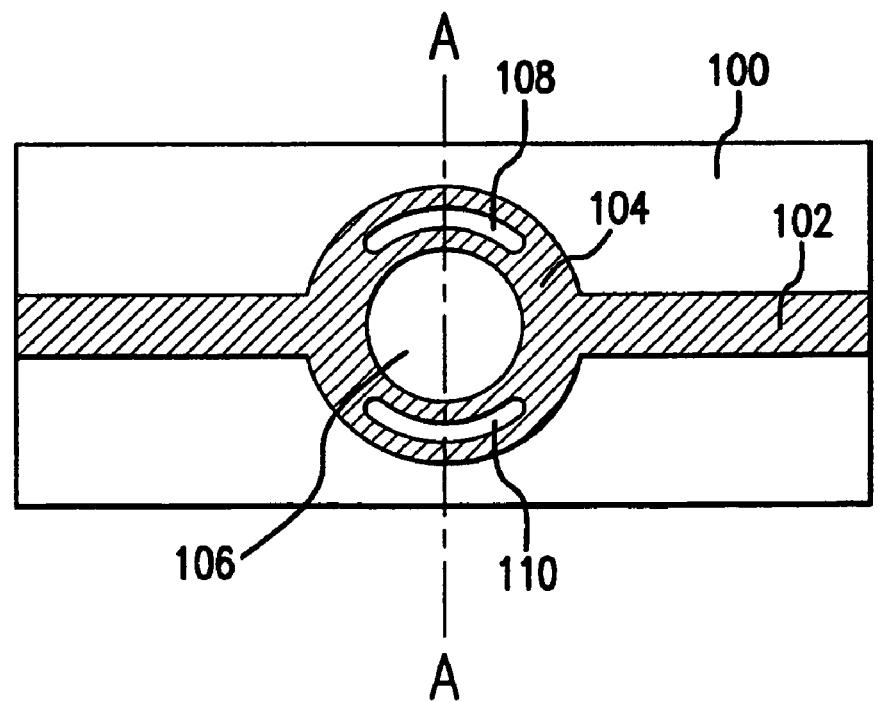
FIG. 4 is a top view of a test probe access structure on a test via on a printed circuit assembly after solder paste application and reflow.

FIGS. 3 and 4 illustrate an exemplary embodiment of a test probe access structures 108, 110 on a via 104. As shown in FIGS. 3 and 4, two raised bead probes 108, 110 are formed on the annulus of the via 104. The two test probe access structures 108, 110 provide margin in case there is misalignment during formation and one of the beads are formed over the via through hole 106. If the solder from one of the beads is formed over the via through hole 106 or runs into the through hole 106 during solder reflow, making that bead ineffective, the other bead will still form on the outer part of the annulus of the via copper 104. There may be cases where more or fewer than two test via probe access structures 108, 110 are desired on a single via 104, which is anticipated by the present invention. Although FIGS. 3 and 4 show traces 102, traces connected to a via are not necessarily exposed on the surface of the printed circuit assembly, but are more likely embedded within, such that the via is the only outer surface test contact location available.

A typical via through hole 106 diameter (Y) may be approximately 12.5 mils; but may be 5 to over 100 mils. The diameter of the via (Z) may be approximately 25 mils total or have a width (X) of approximately 12.5 mils running around the through hole. The diameter (Z) of the via may be 15 to over 100 mils.

In one exemplary method of manufacture of test probe access structures 108, 110 on vias 104, existing printed circuit assembly fabrication processes may be utilized, thereby keeping costs low. As known in the art, virtually every printed circuit assembly is constructed with high-speed signals appearing on the outer layers due to the ability to more easily control impedances on the outer layers. The two outer layers are also typically coated with a solder mask that is used to assure that only exposed copper (or other conductive materials) areas will retain solder paste that is applied via a stencil printing process. Holes in the solder mask assure that only those areas of copper that should be soldered will receive solder as the solder paste reflows.

Figure 7A:
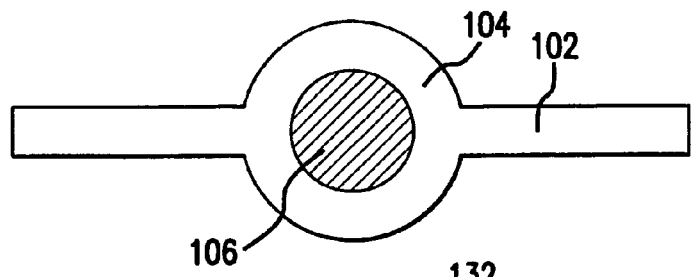
FIG. 7A shows a via with a test via on a printed circuit assembly.
Figure 7B:
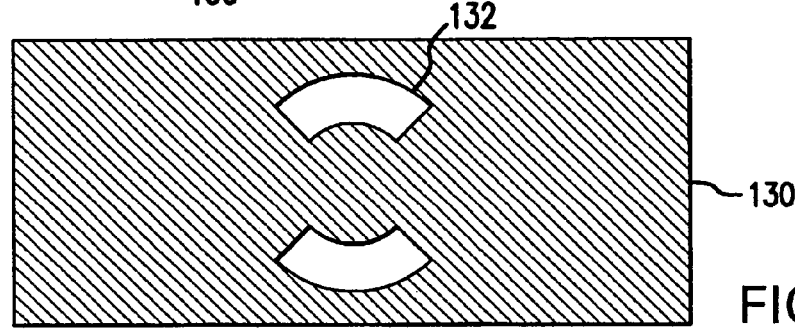
FIG. 7B shows a solder mask of a test access structure.
Figure 7C:
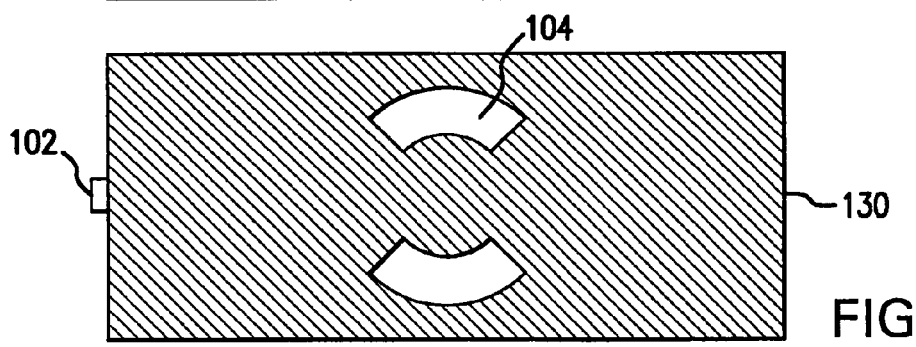
FIG. 7C shows the solder mask of FIG. 7B properly aligned over the via and test via of FIG. 7A.
Figure 7D:
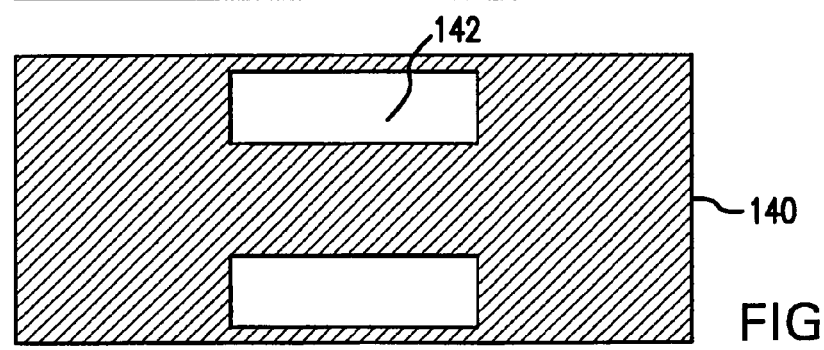
FIG. 7D shows a solder stencil of a test access structure.
Figure 10:
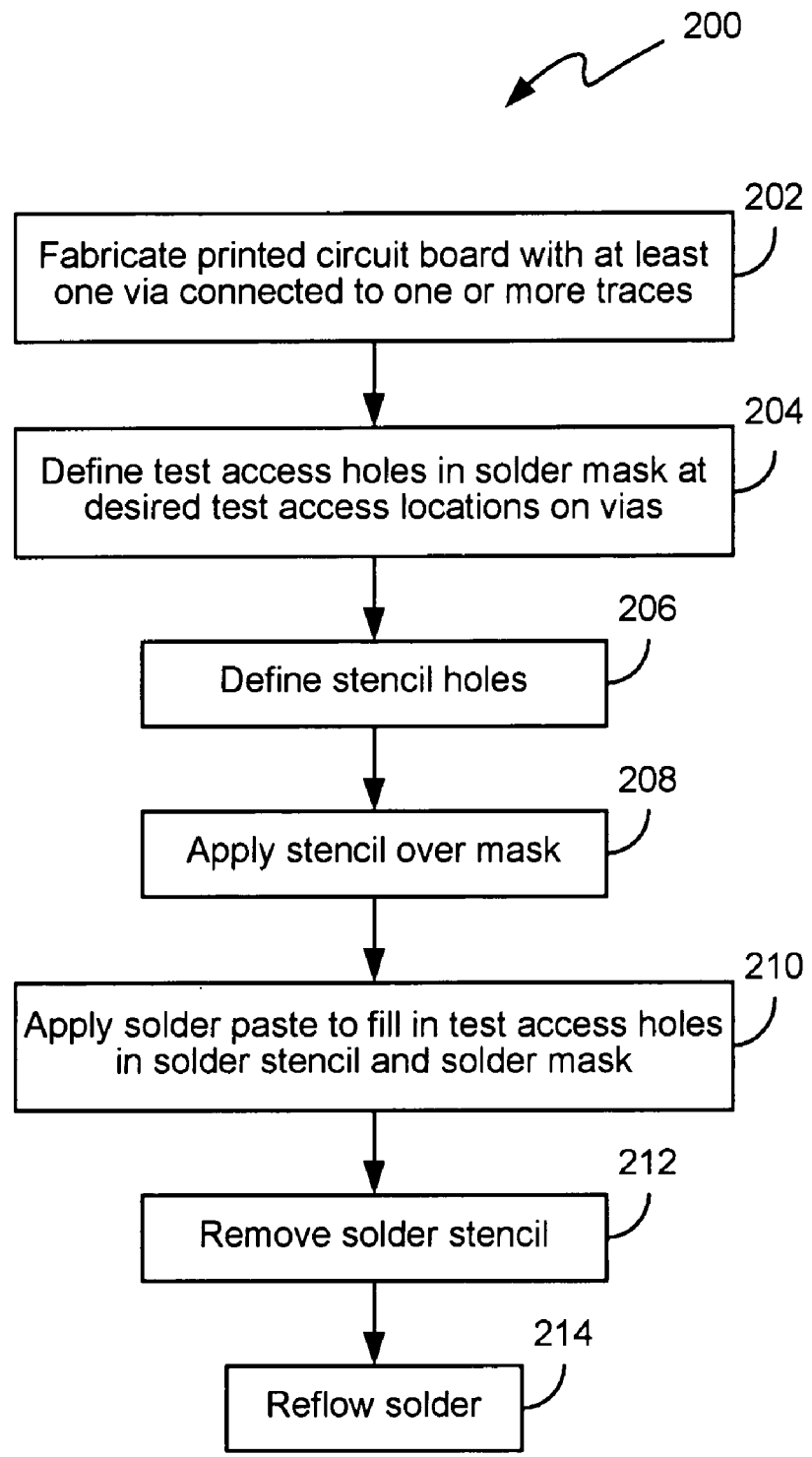
FIG. 10 is an operational flow chart illustrating a method of manufacture of a test access structure on a test via of a via on a printed circuit assembly.

FIG. 10 is an operational flowchart illustrating a preferred method 200 of manufacture of a test probe access structure 108, 110 on a via 104 of a printed circuit assembly 100, and FIGS. 7A-E include various views of a portion of a printed circuit assembly 100 during manufacture of the test probe access structure 108, 110 in accordance with the method of FIG. 10. In one anticipated method of manufacture of the test probe access structures 108, 110, the printed circuit assembly 100 is fabricated in step 202 to the point of forming the vias 104 connecting one or more traces on one or more layers on or inside the printed circuit assembly. Test probe access structures or bead probes 108, 110 will be formed on vias 104. In step 204, test access holes 132 are defined and implemented in the printed circuit assembly solder mask 130 at locations around an upper surface of vias 104 at desired test probe access locations, as illustrated in FIGS. 7B-C.

Figure 7E:
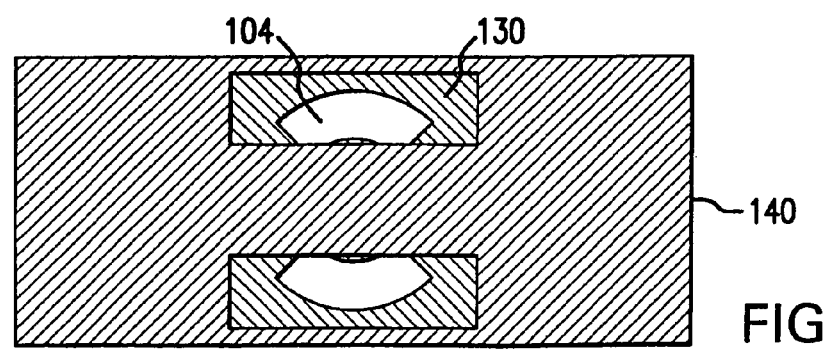
FIG. 7E shows the solder stencil of FIG. 7D properly aligned over the solder mask of FIG. 7B and the via and test via of FIG. 7A.

In step 206, holes 142 are defined in a solder stencil 140 (shown in FIG. 7D) and in step 208 the solder stencil is applied over the mask 130 (shown in FIG. 7E), such that the holes 142 in the solder stencil 140 are aligned over the test access holes 132 in the solder mask 130 over an annulus of via 104, as shown in FIG. 7E.

Once the test access holes 132 are located and the solder mask 130 and solder stencil 140 are produced, printed circuit assembly fabrication proceeds as is normal in the art. To this end, in step 210, solder paste is applied to the assembly, thereby filling the solder mask holes 132, using standard well-known stencil printing processes. The area of hole 142 and the thickness of the solder stencil 140 determines the volume of solder paste that ends up in the hole 132 after reflow. It should be noted that the solder mask hole may not be completely filled when the solder paste is deposited, but any voids are filled during the reflow step. In step 212, the solder stencil 140 is removed leaving bricks or islands of solder paste (not shown).

Figure 5:
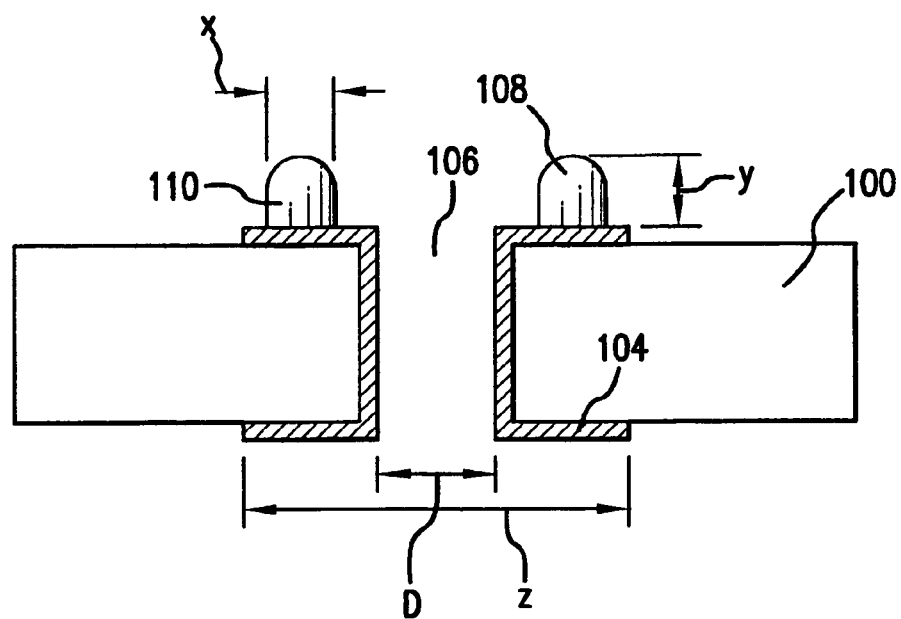
FIG. 5 is a cross-sectional, side view of a test probe access structure on a test via on a printed circuit assembly.

In step 214, the solder paste is soldered to the conductive areas exposed by the solder mask holes 132, for example using standard reflow soldering techniques. Soldering is a very well understood process. As known in the art, the solder paste is approximately 50% metal and 50% flux by volume. When the solder paste melts during reflow soldering, the volatile components of the flux vaporize reducing the end volume and the remaining flux components prevent oxidation of the solder. Surface tension causes the paste to reform from a rectilinear shape, as defined by the stencil hole 142, into a semi-annular, hemi-ellipsoidal shape defined by the exposed copper on via pad 104 through solder mask hole 132. The melted solder will retract from the walls of hole 132 in the solder mask 130 and form a substantially rounded bead 108, 110 that is semi-annular, hemi-ellipsoidal in shape, as illustrated in FIGS. 4-5 that has a thickness H and projects some distance D above the solder mask 130. The test probe access structure thickness H in the z-dimension of the x-, y-, z-coordinate system, is determined by the area of the exposed via and the original volume of the solder paste.

Figure 8A:
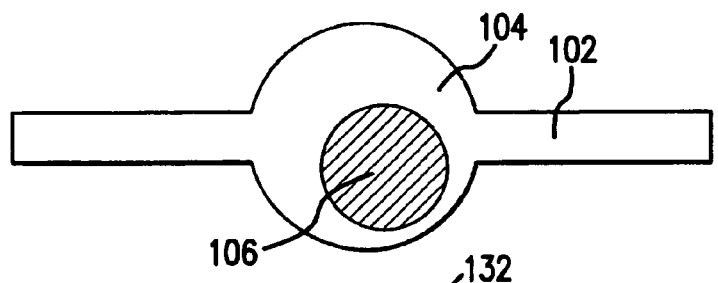
FIG. 8A shows a via pad with a misaligned via drill hole on a printed circuit assembly.
Figure 8B:
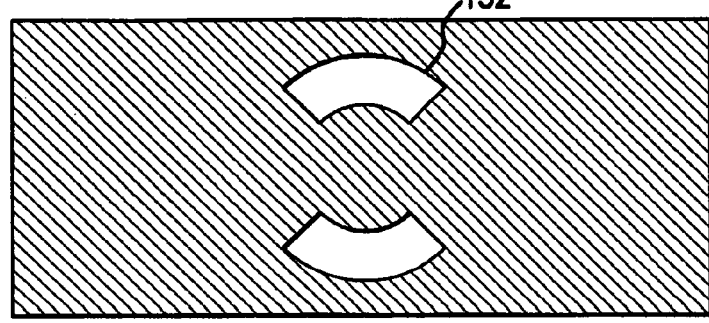
FIG. 8B shows a solder mask of a test access structure.
Figure 8C:
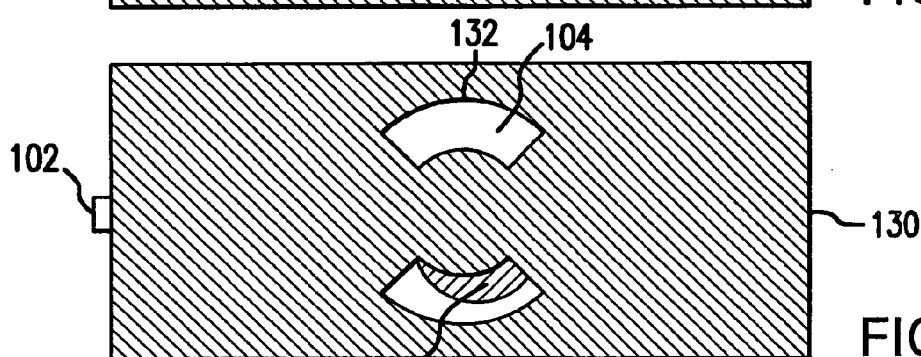
FIG. 8C shows the solder mask of FIG. 8B properly aligned over the via with misaligned test via of FIG. 8A.
Figure 8D:
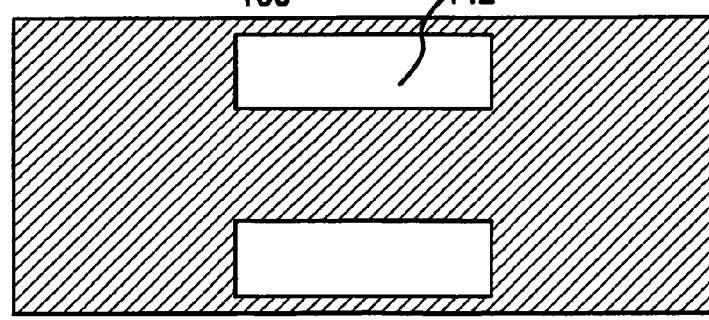
FIG. 8D shows a solder stencil of a test access structure.
Figure 8E:
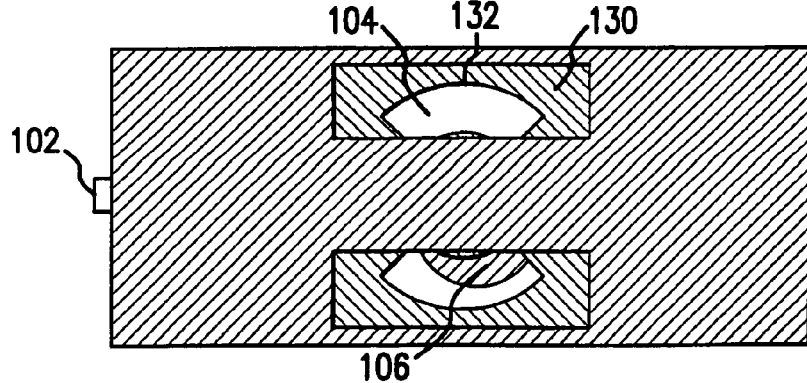
FIG. 8E shows the solder stencil of FIG. 8D properly aligned over the solder mask of FIG. 8B layered over the via and misaligned test via of FIG. 8A.
Figure 9A:
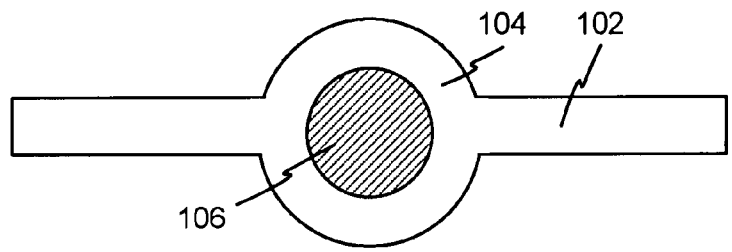
FIG. 9A shows a via with a test via on a printed circuit assembly.
Figure 9B:
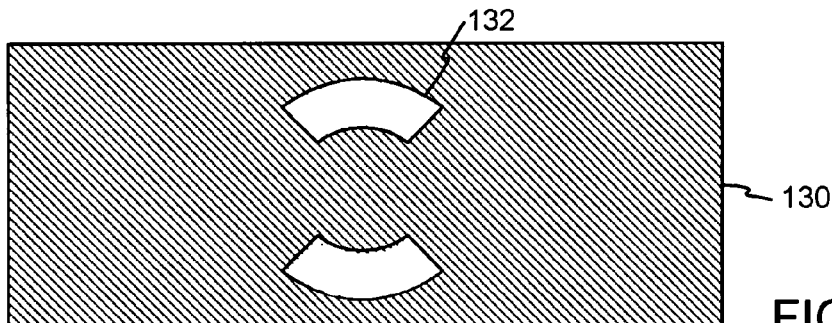
FIG. 9B shows a solder mask of a test access structure.
Figure 9C:
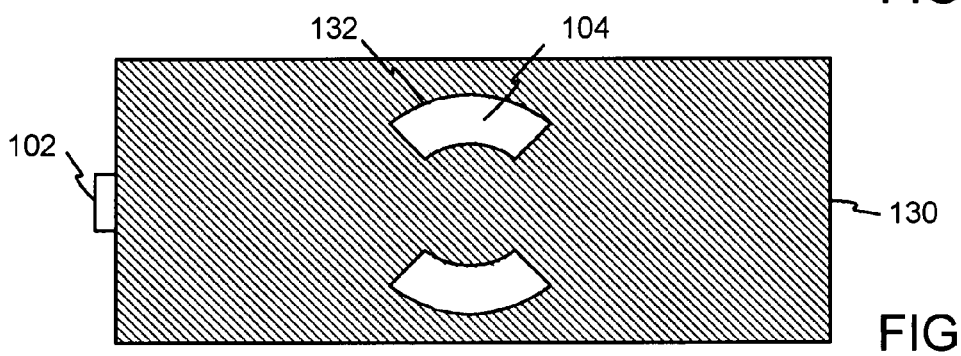
FIG. 9C shows the solder mask of FIG. 9B properly aligned over the via and test via of FIG. 9A.
Figure 9D:
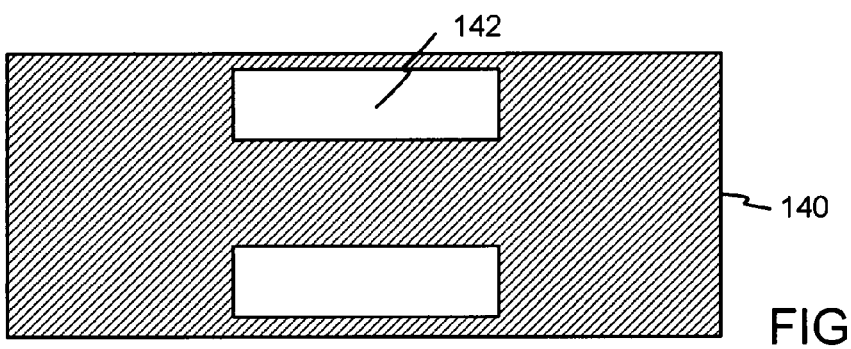
FIG. 9D shows a solder stencil of a test access structure.
Figure 9E:
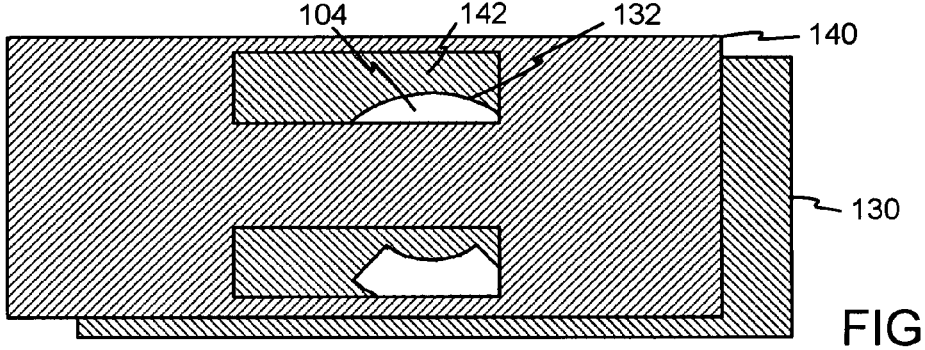
FIG. 9E shows the solder stencil of FIG. 9D misaligned over the solder mask of FIG. 9B and the via and test via of FIG. 9A.

FIGS. 8A-E show a situation where a via hole 106 is potentially misaligned on the via pad 104 (as seen in FIG. 8A) and its potential impact on the formation of test probe access structures 108, 110. Essentially, one of the test probe access structures 108, 110 will be formed over the via hole 106 or will flow into the via hole 106 during solder reflow. However, the other test probe access structure will still be formed on the outer annulus of the plated copper via pad 104. FIGS. 9 A-E show a situation in which a solder stencil 140 and its apertures 142 is misaligned. As noted in the example above, this may result in one test probe access structure being formed over or flowing into the via hole 106 during solder reflow, but will still yield at least one test probe access structure being realized after fabrication. The second bead probe will form normally and there will be a bead probe present for probing and test. This is possible, because the alignment error that comprises the first bead flowing into the via hole helps to assure that the second bead will be formed on the via properly.

It should be apparent to one of ordinary skill that more than two test probe access structures would provide further benefits in this regard, for example, forming four test probe access structures or bead probes around the annulus of via 104 would provide further benefits from any potential fabrication misalignment, while still yielding one or more test probe access structures on the via 104 after fabrication. The affinity of solder for copper will further help ensure the bead probed structure forms on the copper plated via 104, rather than on the solder mask 130 or flowing into the via hole 106. Under current fabrication techniques; registration tolerances; and trace, via and bead probe dimensions, any typical fabrication misalignment or misregistration will still ensure at least one bead probe being properly formed on the surface of the copper via 104.

Figure 6:
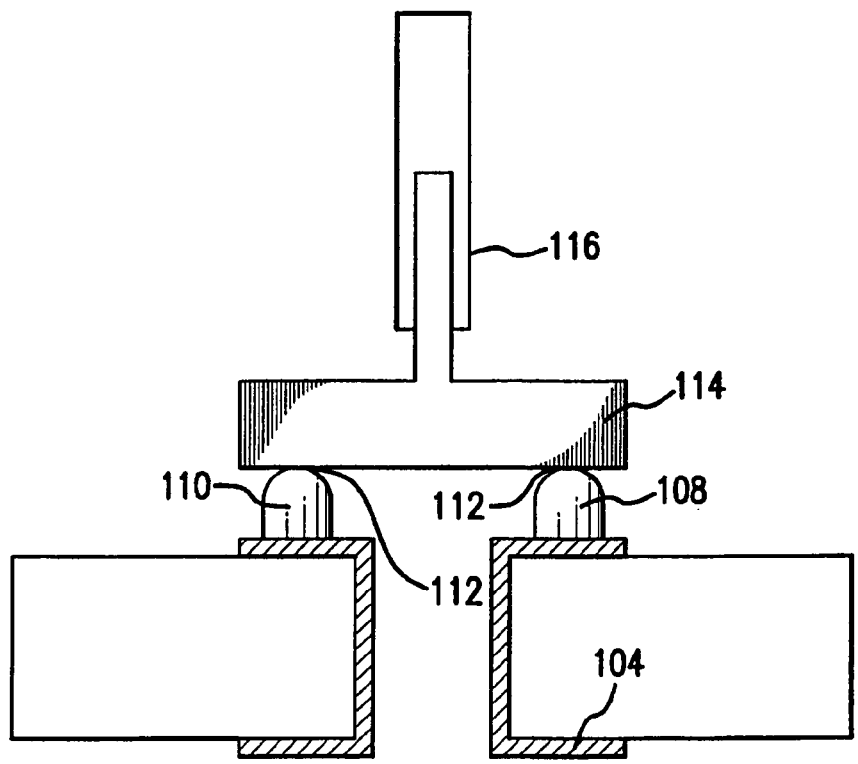
FIG. 6 is a cross-sectional, side view of a test probe contacting a test probe access structure on a test via on a printed circuit assembly.

An important factor in probing a bead probe or test probe access structure 108, 110 is its electrical contact resistance with the fixture probe contacting it. Bead probes may have or develop surface contaminates, residues or oxides on the outer surface that may degrade or raise the contact impedance. One exemplary method to overcome this contact impedance problem due to surface residues, is to deform the bead probe with the fixture probe. FIGS. 5-6 illustrate a substrate 100, such as FR4 board substrate with a plated copper via 104 having a through hole 105 at a location where one or more test probe access structures or bead probes 108, 110 are formed on the exposed surface of the via 104. As shown in FIG. 5, test probe access structures 108, 110 have a substantially rounded upper surface after solder reflow.

FIG. 6 illustrates the same test probe access structures 108, 110 with a deformed upper surface 112 after a fixture probe 114 has come into compressive contact with test probe access structures 108, 110 with a predetermined force. For the purposes of discussion, assume the fixture probe 114 has a substantially flat surface 118 that comes into contact with the test probe access structures 108, 110. If the radius of curvature is tight enough, test probe access structures 108, 110 made of solder are subject to deformation when a fixture probe 114 compressively contacts them with a predetermined force. A typical fixture probe force is approximately 4-8 ounces. The yield strength of typical solders (both leaded and lead-free) is approximately 5000 psi. Thus, when a fixture probe 114 compressively contacts a newly formed bead or test probe access structure 108, 110 for the first time, the test probe access structure 108, 110 will deform with a substantially flattened top, as shown in FIG. 6. The flat area 112 grows as the solder deforms, until the flat area 112 is great enough to support the fixture probe force. The process of deforming the bead or test probe access structures 108, 110 displaces any surface oxides, contaminants or residues and gives the fixture probe 114 excellent electrical contact to the solder of the test probe access structures 108, 110.

By way of analogy, one can think of a potato as a bead probe and the potato skin as surface contaminates, residues or oxides. The potato is placed on a flat, hard surface. A second object, representing a fixture probe, having a flat, hard surface with a diameter at least as large as that of the potato is brought into compressive contact with the potato until the surface of the potato begins to deform and flatten. As this happens, the potato skin will be deformed and the flat surface of the second object, representing the fixture probe will come into contact with the inside of the potato, representing uncontaminated solder of the bead probe.

As an exemplary model, the yield strength of solder is approximately 5000 psi or 0.005 pounds per square mil, or 0.08 ounces per square mil. Thus, to support a typical 4 ounce flat probe, the flattened area 32 of the test probe access structure 108, 110 must be 4/0.08 or 50 square mils. Assume a 5 mil wide by 20 mil long bead 108, 110 that is approximately 3 mils high. Assume that when the fixture probe 114 first touches the bead 108, 110, there is no flattened surface area. Then as the fixture probe 114 pushes down on the solder, the area that is flattened 112 approximates an ellipse with a 1:4 width/length ratio. As this area increases, the solder yield begins to slow until there is a "footprint" of 50 square mils, or about ½ the total area of the bead itself. Once the surface area is large enough to support the fixture probe force, no further deformation occurs. Subsequent probing does not produce any further deformation.

A bead 108, 110 that is too small will flatten until the point where the deformation is catastrophic, causing the bead to "mushroom" out and flatten onto the solder mask. Parts of it may break off as a result. If on the other hand, a bead 108, 110 is too big, the amount of deformation will be small and the surface contaminants may not be displaced enough to give good electrical contact. Thus, the size of the bead 108, 110 with respect to the expected probing force is an important design parameter. The inventor's have determined that the amount of deformation suggested in the above example and the manufacturing method described below give excellent results for test probe access structure (bead) 108, 110 longevity and contact resistance.

The dimensions of the solder mask and stencil holes can be used to calculate the bead 108, 110 height and length. The height of the resulting bead 108, 110 may be determined by the area of the solder mask hole 132 and the volume of the solder paste applied to the assembly or the pre-reflow solder paste. The pre-reflow solder paste volume is the area of the solder stencil hole 142 multiplied by the stencil thickness. Since solder paste, by volume, is approximately 50% flux, about 50% of the paste volume will be left as a solder bead 108, 110 after the reflow process step. The height H of the bead 108, 110 may be such that the resultant bead 108, 110 on via 104, will protrude above the solder mask 130 a distance D, which may be 1 to 3 thousandths of an inch. The height H of bead 108, 110 is approximately the post-reflow solder volume divided by the solder mask opening area.

Current trace widths are typically 3-5 mils wide, but may be as wide as 20 mils wide. Via widths are typically approximately 25 mils wide, but may be 15 to 100 mils. Test probe access structures or bead probe structures 108, 110 may be approximately 3-5 mils wide by 15-20 mils long and may project 1-4 mils above the exposed surface of the printed circuit assembly.

Fixture probe 114 may be any known fixture probe with a substantially flat or smooth surface, such as a standard 35 mil round head/flat-faced plated fixture probe. Current design for test guidelines for ICT (in circuit testers) require a minimum 30 mil diameter testpad probed by a chisel or spear tipped probe. State of the art ICT fixtures can reliably probe down to 23 mil diameter targets. Thus, the small test probe access structures or bead structures 108, 110 may be probed with any industry standard probes with approximately 23-35 mil diameter flat head.

While a waffle or other patterned surface fixture probe is possible to use, a flat surfaced fixture probe is considered better, as the aforementioned surface deformation provides excellent electrical contact results and overcomes certain drawbacks of a waffle surfaced fixture probe. For example, a substantially flat surfaced fixture probe will not dig into the surface and should therefore not damage the bead 108, 110 on successive probing. Also, a waffle-patterned surface fixture probe will collect contaminants more easily and at the same time will be harder to clean. Also, the sharp points of a waffle patterned fixture probe may wear out as many assemblies are tested. A relatively smooth or flat surfaced avoids these drawbacks of a waffle or patterned surface fixture probe.

Figure 11:
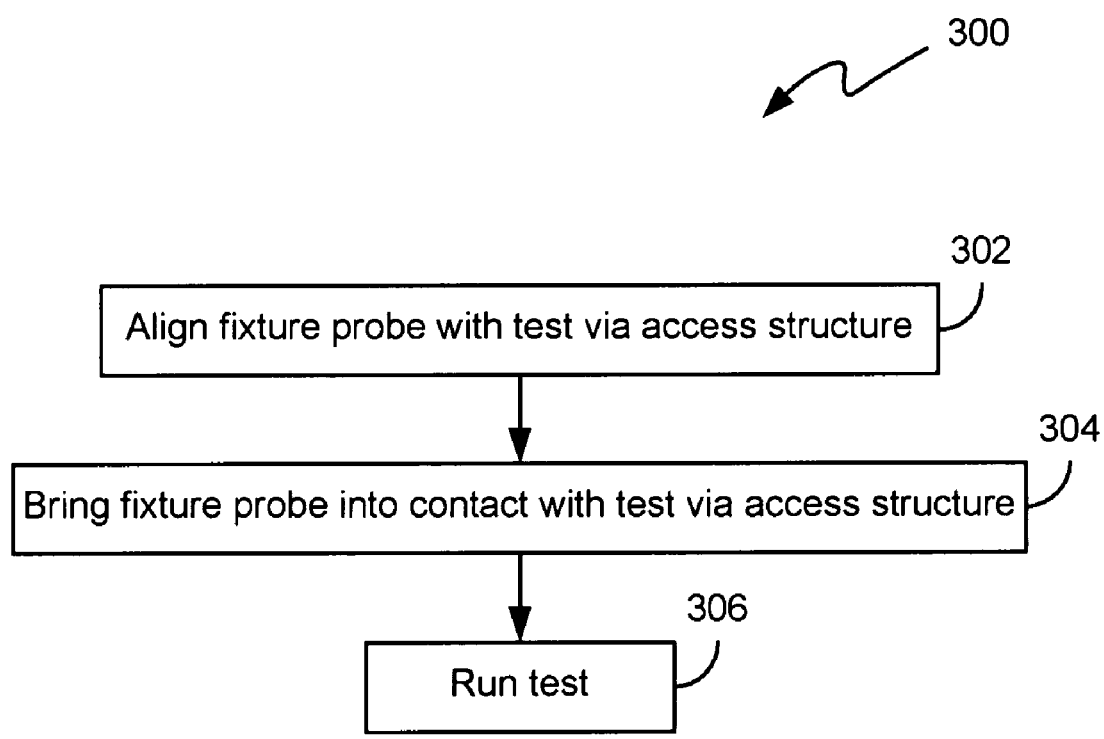
FIG. 11 is an operational flow chart illustrating a method of testing a test access structure on a test via of a via of a printed circuit assembly.

FIG. 11 shows a flow chart for a method 300 for probing and testing test probe access structures 108, 110 on vias 104 of a printed circuit assembly 100. With reference to FIGS. 6 and 11, a fixture probe 114 is aligned 302 with test probe access structures 108, 110 on a via of the printed circuit assembly 100. Test probe 114 is brought into compressive contact 304 with the test probe access structures 108, 110. Any desired in-circuit or other known test may be run 306 by a tester (not shown), such as the 3070 tester by Agilent Technologies, Inc. of Palo Alto, Calif.

It will be appreciated from the above detailed description of the invention that the present invention uniquely solves the conflict problems faced by traditional techniques for test probe access structure placement on printed circuit assemblies. In particular, in the prior art paradigm, test probe access structures are treated as "targets" on a printed circuit assembly that are hit by probes. In the new paradigm as presented herein, the probes are integrated into the printed circuit assembly itself using solder beads or high points on vias, and the fixture probes are treated as the targets. Since in the invention the perturbations of vias and traces in the x- and y-dimensions are minimized, and the z-dimension above the via is utilized to implement test probe access structures, test probe access structures may be placed almost anywhere a via can be places. This allows the placement decision of the test probe access structures on the assembly to be made according to the locations of the fixture probes of a given test fixture rather than vice versa as done in the prior art.

Although this preferred embodiment of the present invention has been disclosed for illustrative purposes, those skilled in the art will appreciate that various modifications, additions and substitutions are possible, without departing from the scope and spirit of the invention as disclosed in the accompanying claims. For example, the test probe access targets may be deformed by some means other than by contact with the fixture probes. It is also possible that other benefits or uses of the currently disclosed invention will become apparent over time.

What is claimed is:

1. A method for probing an access point on a printed circuit assembly,
   wherein the access point includes (i) a via having an electrically conductive perimeter in the shape of an annulus, and (ii) a test probe access structure which includes first and second bead probes formed on first and second positions on the electrically conductive perimeter, the bead probes being formed of electrically conductive solder, and being formed such that either (a) both of the first and second bead probes project in a dimension substantially perpendicular to the printed circuit assembly, or (b) one of the first and second bead probes project in a dimension substantially perpendicular to the printed circuit assembly and the other of the first and second bead probes is incorrectly formed so as to make the other of the first and second bead probes ineffective to project in a direction substantially perpendicular to the printed circuit assembly;
   the method comprising:
   aligning a fixture probe with the access point;
   engaging the fixture probe with the access point, wherein either (a) the engaging causes the fixture probe to make physical contact with both of the projecting first and second bead probes, or (b) the engaging causes the fixture probe to make physical contact with the one of the first and second bead probes which projects in a direction substantially perpendicular to the printed circuit assembly, but not with the other of the first and second bead probes; and
   exerting compressive contact between the fixture probe and the access point, so as to deform (a) both of the first and second bead probes which project in a direction substantially perpendicular to the printed circuit assembly, or (ii) the engaged one of the first and second bead probes, in the case where the other one of the first and second bead probes is incorrectly formed;
   whereby the deforming facilitates electrical contact between the fixture probe and the test probe access structure.

2. A method as recited in claim 1, wherein the electrically conductive perimeter of the via has the shape of an annulus.

3. The method of claim 2 further comprising compressively contacting said at least one test probe access structure that is formed around the annulus of the via, to deform an upper surface of said at least one test probe access structure to disturb any surface contaminants thereon and improve electrical contact with said at least one test probe access structure.

4. The method of claim 2, wherein electrically contacting said at least one test probe access structure that is formed around the annulus of the via comprises:
   electrically contacting at least one semi-annular, hemi-ellipsoidal solder bead that is formed around the annulus of the via.

5. The method of claim 2, wherein electrically contacting said at least one test probe access structure that is formed around the annulus of the via comprises:
   electrically contacting at least two semi-annular, hemi-ellipsoidal solder beads that are formed around the annulus of the via.

6. The method of claim 2, wherein said at least one test probe structure is formed exclusively around the annulus of the via.

7. The method of claim 1, wherein said solder bead is approximately 3-5 mil wide by 15-20 mil long on said via.

8. The method of claim 7, wherein said solder bead projects approximately 1-4 mil above said exposed surface of said printed circuit assembly.

9. The method of claim 1, wherein the via is a through hole via.

* * * * *